(12) United States Patent
Lorrain et al.

(10) Patent No.: US 11,886,719 B2
(45) Date of Patent: Jan. 30, 2024

(54) MEMORY CIRCUIT FOR STORING PARSIMONIOUS DATA

(71) Applicant: COMMISSARIAT A L'ENERGIE ATOMIQUE ET AUX ENERGIES ALTERNATIVES, Paris (FR)

(72) Inventors: Vincent Lorrain, Gif sur Yvette (FR); Olivier Bichler, Gif sur Yvette (FR); David Briand, Gif sur Yvette (FR); Johannes Christian Thiele, Gif sur Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 49 days.

(21) Appl. No.: 17/843,975

(22) Filed: Jun. 18, 2022

(65) Prior Publication Data
US 2023/0030058 A1    Feb. 2, 2023

(30) Foreign Application Priority Data

Jun. 25, 2021 (FR) ...................... 2106832

(51) Int. Cl.
*G06F 3/00*    (2006.01)
*G06F 3/06*    (2006.01)

(52) U.S. Cl.
CPC ............ *G06F 3/0626* (2013.01); *G06F 3/064* (2013.01); *G06F 3/0653* (2013.01); *G06F 3/0683* (2013.01)

(58) Field of Classification Search
None
See application file for complete search history.

(56) References Cited

FOREIGN PATENT DOCUMENTS

| CN | 109 472 350 A | 3/2019 |
| CN | 110 569 970 A | 12/2019 |
| CN | 112073071 A * | 12/2020 |
| EP | 3 726 733 A1 | 10/2020 |

* cited by examiner

*Primary Examiner* — Midys Rojas
(74) *Attorney, Agent, or Firm* — BakerHostetler

(57) ABSTRACT

A memory circuit for storing parsimonious data and intended to receive an input vector of size Iz, includes an encoder, a memory block comprising a first memory region and a second memory region divided into a number Iz of FIFO memories, each FIFO memory being associated with one component of the input vector, only non-zero data being saved in the FIFO memories, a decoder, the encoder being configured to generate an indicator of non-zero data for each component of the input vector, the memory circuit being configured to write the non-zero data of the input data vector to the respective FIFO memories and to write the indicator of non-zero data to the first memory region, the decoder being configured to read the outputs of the FIFO memories and the associated indicator in the first memory region.

11 Claims, 10 Drawing Sheets

MEMORY CIRCUIT FOR STORING PARSIMONIOUS DATA

CROSS-REFERENCE TO RELATED APPLICATION

This application claims priority to foreign French patent application No. FR 2106832, filed on Jun. 25, 2021, the disclosure of which is incorporated by reference in its entirety.

FIELD OF THE INVENTION

The invention relates to the field of FIFO (first-in first-out) memories especially when used to form pipeline structures of line-buffer type. This type of structure is in particular used in hardware architectures for computing convolutions with 2D or 3D data.

BACKGROUND

Convolution operators are widely used to implement convolutional neural networks.

In convolutional neural networks, the use of transfer functions such as ReLU tends to make the data output from the layers of neurons increasingly parsimonious as the inference process progresses.

In other words, a high percentage of zero values is observed in the data processed within such networks.

A general objective sought when designing the hardware architecture of computers is optimization of the size of the memories employed, in order to minimize their physical size and therefore the space occupied by these memories on the circuit board.

In the case of a convolution layer computer, the size of the FIFO memory used is directly related to the sizes of the input data matrices and to the size of the convolution kernel.

However, when the data are parsimonious, it is theoretically possible to decrease the size of the FIFO memories simply by not saving zero values. The improvement in memory occupancy is proportional to the degree of parsimony.

One problem to be solved in this field is that of providing a FIFO memory that, while still being compatible with a pipelined computation architecture, is customized for parsimonious data in that it allows only non-zero data to be saved, in order to decrease the size of the memory.

Hardware-architecture solutions allowing convolutional neural networks to be implemented may be classed according to their general approach to computation into three categories.

Generic computational solutions encompass CPU and GPU computers in the broad sense, i.e. computers that are not exclusively intended to implement neural networks. These solutions are widely used to study networks, but there genericness/complexity limits performance. The approach employed therewith consists in optimizing the neural network dynamically as regards the operators of the GPU/CPU processor then in applying the network in its optimized state. However, this approach limits the flexibility of the application once optimized for the GPU/CPU processor.

Dedicated solutions the topology of which is programmable include architectures with a computational core designed and optimized for neural networks. However, such cores are used recursively to process the calculations of the network. They are reconfigured depending on the processed layer. This approach allows a good performance to be achieved, but these solutions have certain limitations. Firstly, resources must be judiciously allocated depending on the layers computed, this being complex and often the utilization rate of elementary computing units is not 100%. Secondly, most of these computers use an external DDR memory, and thus computing time is not strictly predictable, raising questions in respect of application criticality, and lastly the recursive use of computing resources generates high latencies and does not allow the use of specific hardware optimization.

Computational solutions the topology of which is unchangeable are encountered in the field of FPGA programmable logic circuits. However, these solutions are based on the ability to synthesize a different network. The need for flexibility is not adequately catered for: if the network or the application changes, the entire computer must be modified. This approach is not flexible enough for realization of an instance on an ASIC.

Generally, prior-art FIFO memories do not allow data to be stored depending on their value in order to optimize the size of the memories.

SUMMARY OF THE INVENTION

The invention provides a new FIFO memory architecture customized for parsimonious data. The provided FIFO memory is composed of an encoder, of a decoder and of a memory block. Encoding the data allows only non-zero data to be saved in the memory block, the size of which may thus be decreased.

The invention may be used to design a row of pipeline registers intended to be used in a convolution computer, and especially in hardware architectures for implementing convolutional neural networks.

The invention allows the occupancy of memory space to be increased without decreasing the performance of the computer.

One subject of the invention is thus a FIFO memory circuit for storing parsimonious data, said circuit being configured to receive an input data vector of size Iz at least equal to 1, and comprising:
  an encoder,
  a memory block comprising a first memory region dedicated to encoder information and a second memory region dedicated to the data, the second memory region being divided into a number Iz of FIFO memories, each FIFO memory being associated with one component of the input vector, only non-zero data being saved in the FIFO memories,
  a decoder,
  the encoder being configured to generate an indicator of non-zero data for each component of the input vector,
  the memory circuit being configured to write the non-zero data of the input data vector to the respective FIFO memories and to write the indicator of non-zero data to the first memory region,
  the decoder being configured to read the outputs of the FIFO memories and the associated indicator in the first memory region to reconstruct the data vector,
  the encoder being configured to rearrange the order of the non-zero data in the data vector so as to balance the number of non-zero data saved in each FIFO memory and the decoder being configured to apply the inverse operation of the encoder to the outputs of the FIFO memories.

According to one particular aspect of the invention, the encoder is configured to execute the following operations on the input data vector:
- concatenating the non-zero values of the vector at one end of the vector,
- applying a circular rotation to the components of the vector.

According to one particular aspect of the invention, the circular rotation is carried out on a number of values equal to the number of non-zero values of the preceding vector processed by the encoder.

According to one particular aspect of the invention, the decoder is configured to execute the following operations:
- forming a vector of size Iz from the outputs of a number of FIFO memories that is determined on the basis of the indicator of non-zero data read from the first memory region,
- applying to the vector a circular rotation that is the inverse of that applied by the encoder,
- reordering the values of the vector depending on the indicator of non-zero data.

According to one particular aspect of the invention, the inverse circular rotation is determined on the basis of the indicator of non-zero data of the preceding vector processed by the decoder.

According to one particular aspect of the invention, the FIFO memories are dimensioned depending on a degree of parsimony of the input data.

According to one particular aspect of the invention, the memory block is made up of a plurality of memory sub-blocks each comprising a first memory region dedicated to encoder information and a second memory region dedicated to the data, the memory circuit comprising a single encoder and one decoder for each memory sub-block.

Another subject of the invention is a line buffer comprising a plurality of groups of pipeline registers, two consecutive groups of pipeline registers being interconnected by a memory circuit according to the invention.

In one variant embodiment, the line buffer according to the invention comprises a plurality of groups of pipeline registers and a memory circuit according to one embodiment of the invention, the first group of pipeline registers being connected to the input of the encoder of the memory circuit and each decoder of the memory circuit being connected, via its output, to one group of pipeline registers.

Another subject of the invention is a convolution-computing circuit comprising a line buffer according to the invention, the circuit being configured to read data organized into the form of a data matrix each component of which is a vector of size Iz at least equal to 1.

Another subject of the invention is a neuromorphic circuit comprising a convolution-computing circuit according to the invention.

BRIEF DESCRIPTION OF THE DRAWINGS

Other features and advantages of the present invention will become more clearly apparent on reading the following description with reference to the following appended drawings.

DETAILED DESCRIPTION

The invention is described in the context of a use in a convolution layer computer for a convolutional neural network. However, the invention is not limited to this application and relates to any type of architecture requiring parsimonious data to be stored in a FIFO memory during a computation carried out on these data.

Figure 1:
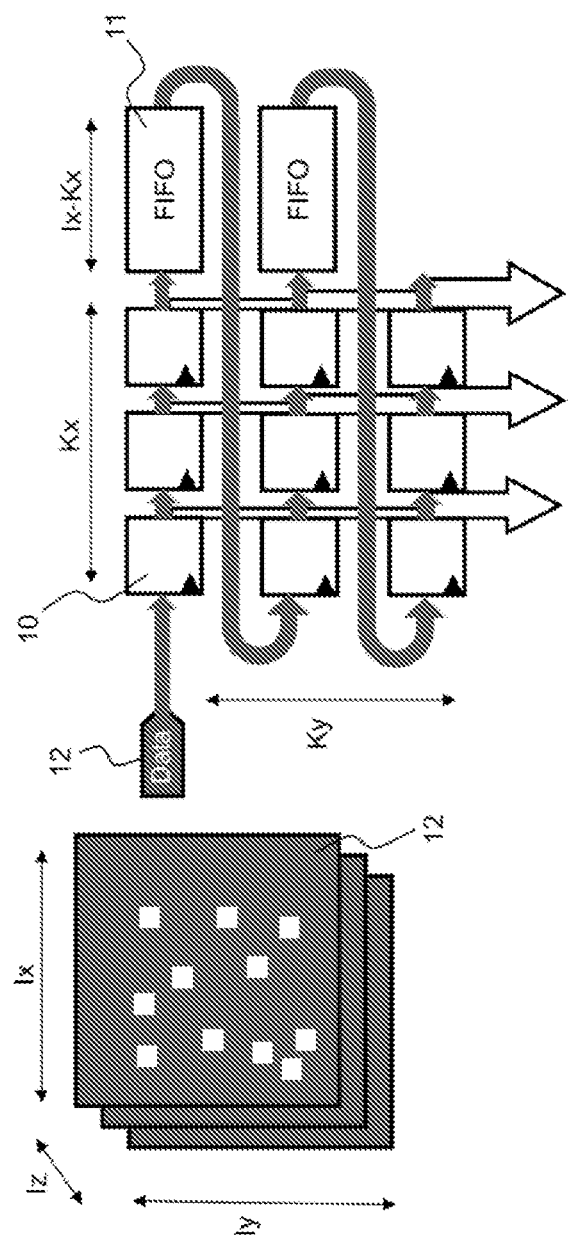
FIG. 1 shows a schematic of a line buffer comprising FIFO memories for performing a convolution computation.

FIG. 1 schematically shows the operating principle of a line buffer employed to perform a convolution computation using a convolution kernel or filter of Kx by Ky size on 3D data of Ix by Iy by Iz size.

For example, the data 12 are images of Ix by Iy size available for Iz separate channels, for example Iz different spectral components.

The data 12 have the particularity of being parsimonious, i.e. they contain a high number of zero values. These data 12 are, for example, generated by a layer of neurons of a convolutional neural network.

The data 12 are schematically shown on the left of FIG. 1.

On the right of FIG. 1, a line buffer has been shown, said line buffer being made up of a set of shift registers 10 that allow the input data 12, which are read sequentially in lines, to be propagated. In other words, at each time a new data vector of size Iz is transmitted to the input of the first shift register.

The device of FIG. 1 comprises Kx by Ky shift registers, this corresponding to the size of the convolutional kernel.

The shift registers 10 are connected in series and organized into Ky rows. At the end of each row of registers, a FIFO memory 11 is used to store the data of an entire row of the input matrix, with a view to applying the convolution filter to the input matrix in a sliding window of Kx by Ky size.

One FIFO memory is required per row with the exception of the last row, i.e. there are Ky−1 FIFO memories in all. Each FIFO memory 11 is at most Ix-Kx in size.

In such a device, the total storage space provided by all of the FIFO memories is therefore equal to (Ix−Kx)*(Ky−1).

One objective of the invention is to decrease the size of the FIFO memories 11, by taking into account the parsimonious aspect of the data.

Figure 2:
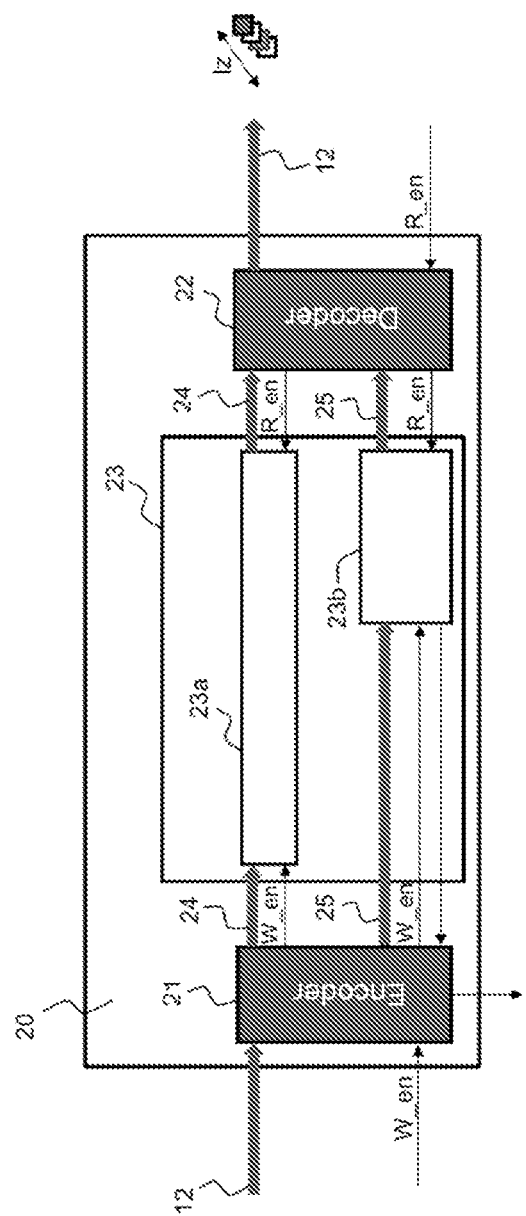
FIG. 2 shows a schematic of a memory circuit for storing parsimonious data according to one embodiment of the invention.

To this end, the invention provides a new type of FIFO memory, which is schematically shown in FIG. 2 according to a first embodiment.

The memory circuit 20 illustrated in FIG. 1 comprises an encoder 21, a memory block 23 and a decoder 22.

The overall function of this memory circuit 20 is to detect zero values in the input data 12 and to save in memory only non-zero values, while outputting from the circuit 20, in a transparent manner, the data in their entirety.

The memory block 23 comprises a first memory region 23a dedicated to storing information specific to the encoding/decoding mechanism and more particularly information relating to the detection of zero values, the deletion thereof before the data are written to memory and the restitution thereof on read-out of the data.

The memory block 23 also comprises a second memory region 23b dedicated to storing the non-zero input data 12.

Thus, the size of the second memory region 23b and therefore of the memory block 23 in its entirety may be significantly decreased with respect to a FIFO memory intended to save all the data over a given spatial or temporal horizon.

The encoder 21 receives the input data 12 from an input interface of the memory circuit 20, detects the zero values in these data and delivers a code vector 24 that is saved in the first memory region 23a of the memory block 23.

Furthermore, the encoder 21 delivers a data vector 25 from which the non-zero values have been deleted or an order to write to the second memory region 23b is given only if the value is non-zero.

For each data vector to be output from the memory circuit 20, the decoder 22 reads the code vector 24 from the first memory region 23a and the associated data vector 25 in the second memory region 23b, then reconstructs the original data vector 12 and delivers it to the output interface.

Figure 3:
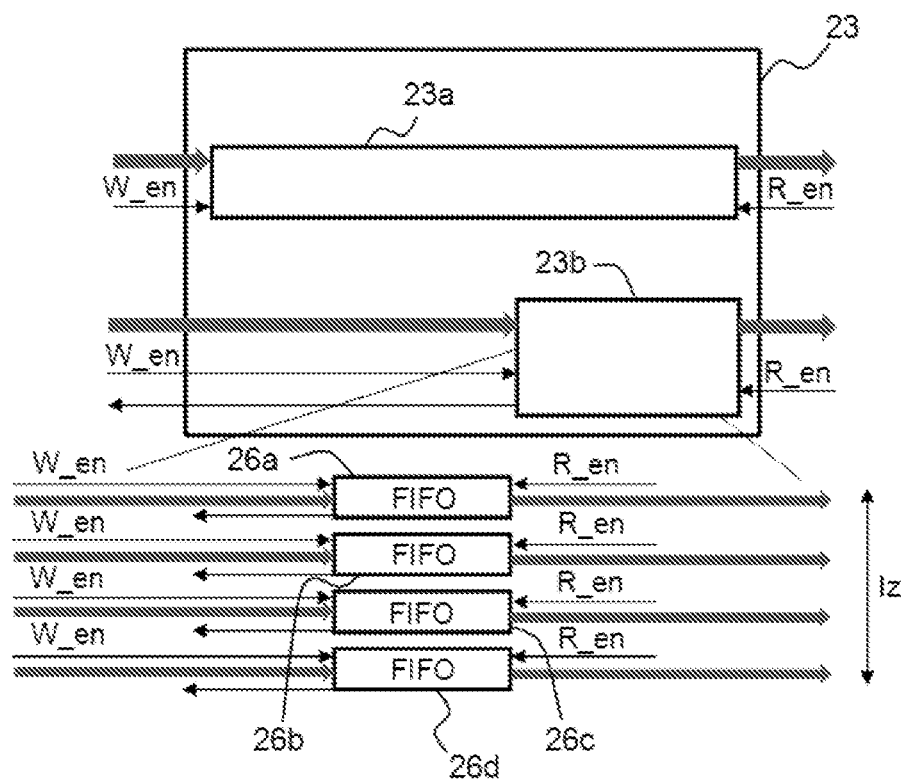
FIG. 3 shows a schematic of the memory block of the memory circuit of FIG. 2.

FIG. 3 shows the second memory region 23b of the memory block 23 in detail.

The second memory region 23b is made up of Iz FIFO memories 26a, 26b, 26c, 26d where Iz is the maximum size of the data vector input into the memory circuit at any given time.

Each FIFO memory is intended to store one element of the data vector of size Iz. In other words, each FIFO memory is associated with one component of the vector and may be written to and read from independently.

The FIFO memories 26a-26d may be separate but also, more generally, consist of a single memory region associated with a read/write mask of size Iz that is received simultaneously with the data vector. The read/write mask indicates which elements of the data vector are to be written to or read from memory.

For example, if Iz is equal to 4, as shown in the example of FIG. 3, the first FIFO memory 26a is used to store the first component of the data vector, the second FIFO memory 26b is used to store the second component of the data vector and so on.

In the case of application to computation of a convolutional layer of the type illustrated in FIG. 1, the first memory region 23a has a minimum depth equal to Ix−Kx and the size of the stored information is defined depending on the encoding strategy employed, but is generally smaller than the size of the data.

The second memory region 23b is, for example, made up of a plurality of independent FIFO memories that are used to store the non-zero values of the input vector. The depth of these FIFO memories is determined empirically depending on the maximum degree of parsimony estimated for the input data.

Alternatively, the second memory region 23b is not divided into independent FIFO sub-memories but is associated with a read/write mask of size Iz that gives a read or write indication to the memory region.

Typically, in the case where the memory 23 is used to form a line buffer of the type illustrated in FIG. 1, the depth of a FIFO memory is equal to (Ix−Kx)*Pzero, where Pzero is the percentage of zero values in the input data.

Thus, taking into account the parsimony of the data allows the size of the FIFO memories 26a-26d to be significantly decreased with respect to prior-art solutions.

In a first embodiment of the invention, the encoder 21 detects zero values in the input vector and generates a code vector 24 that allows the positions of the zero values in this vector to be identified.

For example, the code vector is the same size as the data vector and comprises a zero value when the corresponding datum is zero and a value set to 1 when the corresponding datum is not zero.

Consider a numerical example illustrating the operation of the memory circuit in this first embodiment of the invention.

In this example, the input data vector is equal to [0; 5; 0; 10], and the code vector is thus equal to [0; 1; 0; 1].

The encoder writes the non-zero values of the data vector to the corresponding FIFO memories. In this example, the value 5 is written to the second FIFO memory 26b and the value 10 is written to the fourth FIFO memory 26d.

The code vector is written to the first memory region 23a.

To carry out the decoding, the decoder 22 reads the code vector from the memory region 23a, and deduces therefrom that the non-zero values to be read are stored in FIFO memories 26b and 26d, because the non-zero values correspond to the 2nd position and to the 4th position in the vector.

These two values are read and put back in their original position in the data vector by virtue of the indications of the code vector.

This mechanism thus allows the size of the second memory region 23b to be decreased with respect to a solution requiring all the values to be saved.

Moreover, the data are in general quantified on a number of bits higher than 1, typically 8 or 16 bits for example, whereas the code vectors contain only values coded on 1 bit (1 or 0), and therefore the additional cost of the first memory region 23a is negligible.

One drawback of this first embodiment concerns the distribution of the data between the various FIFO memories 26a-26d. Specifically, if the non-zero values are not distributed in a balanced manner between the various positions of the input vector, there is a risk of saturation of one or more FIFO memories, which may be filled independently of one another. If a new datum cannot be stored because the target FIFO memory is full, then this datum is lost.

The choice of the size of the FIFO memories is therefore a compromise between minimizing this size and achieving an acceptable rate of data loss, i.e. a rate of data loss that does not lead to a significant degradation in the performance of the application.

Another solution allowing the loss of data to be avoided consists in encoding the input data so as to ensure a better distribution of the non-zero data input into the various FIFO memories.

In a second embodiment of the invention, the encoder 21 reorders the non-zero values in the input vector in such a way as to balance the number of values stored in each FIFO memory 26a-26d and thus to maximize their degree of fullness.

Generally, the operation performed by the encoder is an operation whereby non-zero values are repositioned in the vector. This operation may be represented by a transformation matrix M the rows of which correspond to the positions of the values of the input vector X of the encoder and the columns of which correspond to the positions of the values of the output vector Z of the encoder, i.e. $Z = M \cdot X$ M is a binary matrix the values set to 1 of which code the positions of the values in the output vector Z.

Consider an example:

$$X = \begin{pmatrix} 0 \\ 1 \\ 2 \\ 3 \end{pmatrix}, M = \begin{bmatrix} 0 & 1 & 0 & 0 \\ x & 0 & 0 & 0 \\ 0 & 0 & 0 & 1 \\ 0 & 0 & 1 & 0 \end{bmatrix}, Z = \begin{pmatrix} 1 \\ 0 \\ 3 \\ 2 \end{pmatrix}$$

The value x in the matrix M codes the repositioning of the zero value of the vector X in the vector Z. x may thus be set equal to any value.

The function used to reposition or reorder the values of the vector X may thus be represented by a transformation matrix M containing values equal to 1 encoding how the non-zero values of the vector X are repositioned and zero values everywhere else in the matrix.

Any repositioning function may be chosen to distribute the non-zero data between the various FIFO memories.

The encoder therefore applies the matrix M to the vector X to obtain the vector Z. The decoder applies the inverse matrix M−1 to the vector Z to obtain the vector X.

One example of a possible repositioning matrix is a rotation matrix that consists in the identity matrix to which a shift of a certain value has been applied.

One example of a rotation matrix that leads to a shift of one value is:

$$X = \begin{pmatrix} 0 \\ 1 \\ 2 \\ 3 \end{pmatrix}, M = \begin{bmatrix} 0 & 1 & 0 & 0 \\ 0 & 0 & x & 0 \\ 0 & 0 & 0 & 1 \\ 1 & 0 & 0 & 0 \end{bmatrix}, Z = \begin{pmatrix} 3 \\ 0 \\ 1 \\ 2 \end{pmatrix}$$

To carry out the decoding, it is not necessary to know the entire matrix M but only the value of the rotation.

Another example of a possible repositioning matrix is a repositioning matrix that does not change the order of the values in the vector, as illustrated by the following example:

$$X = \begin{pmatrix} 0 \\ 1 \\ 2 \\ 3 \end{pmatrix}, M = \begin{bmatrix} 0 & 1 & 0 & 0 \\ x & 0 & 0 & 0 \\ 0 & 0 & 1 & 0 \\ 0 & 0 & 0 & 1 \end{bmatrix}, Z = \begin{pmatrix} 1 \\ 0 \\ 2 \\ 3 \end{pmatrix}$$

In this example, the non-zero elements of the vector X are repositioned but their order is preserved whereas the zero values are repositioned in any way.

One particular case of repositioning without changing order is concatenation of the non-zero values at one end of the vector. One advantage of this method is that it requires little additional information to be transmitted to the decoder because it is enough to know the initial position of the data. However, one drawback of this repositioning method is that it does not allow the distribution of the load on the various FIFO memories to be balanced.

A method allowing the load distributed to the FIFO memories to be optimized while limiting the amount of encoding data to be saved consists in combining a concatenation operation and a circular rotation operation as illustrated by the following example.

FIGS. 4 to 7 illustrate one particular example of a repositioning function implemented according to the invention.

Figure 4:
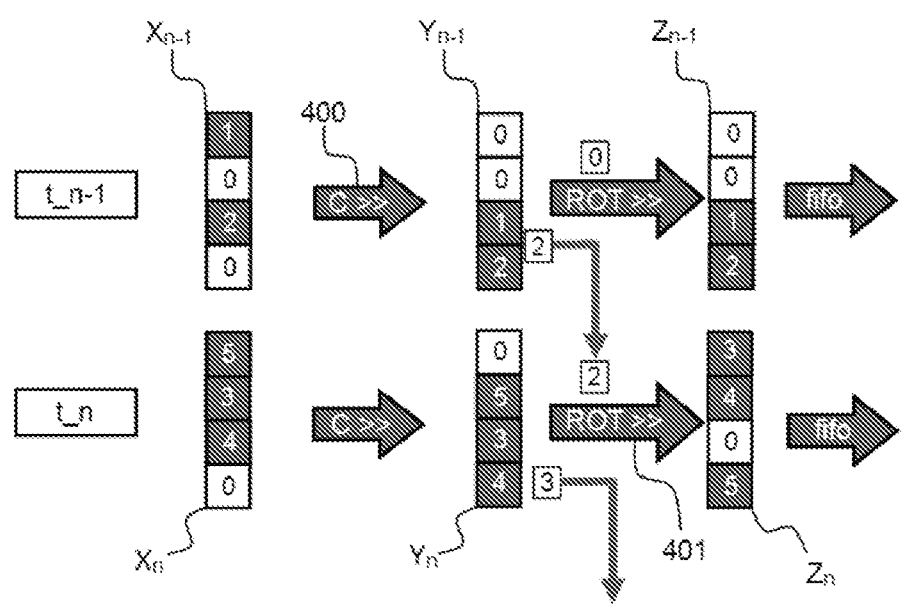
FIG. 4 shows a schematic illustrating the principle of the encoder of the memory circuit of FIG. 2 according to one embodiment of the invention.

One example of the method applied by the encoder to rearrange the order of the data in the input vector is illustrated in FIG. 4.

FIG. 4 shows the data vectors $X_{n-1}$ and $X_n$ received as input by the encoder 21 at two successive times $t_{n-1}$ and $t_n$. The grey boxes of the vector correspond to non-zero values and the white boxes to zero values.

At the time $t_{n-1}$, the encoder applies a first operation 400 that concatenates non-zero values of the vector $X_{n-1}$ at one end of this vector. The order of the values is not modified.

Returning to the preceding example, if the vector $X_{n-1}$ is equal to [0; 5; 0; 10] then the concatenation operation 400 converts this vector into [0; 0; 5; 10].

The modified vector $Y_{n-1}$ is obtained. Next, a second circular rotation operation 401 is applied to the values of the modified vector $Y_{n-1}$, this operation rotating the values of the modified vector by a predetermined rotation value ROT. The value of ROT is equal to 0 initially.

At the time $t_n$, the rotation value ROT is equal to the number of non-zero values of the vector $Y_{n-1}$ at the preceding time. In the example of FIG. 4, the rotation value ROT to be applied at the time $t_n$ to the vector $Y_n$ is equal to 2. The rotation value ROT to be applied at the time $t_{n+1}$ to the vector $Y_{n+1}$ is equal to 3.

After this rotation operation, the modified vector $Z_{n-1}$ is obtained, which is then output from the encoder. Only the non-zero values of this modified vector are written to the corresponding FIFO memories.

In the example of FIG. 4, the two non-zero values of the vector $Z_{n-1}$ are written to the FIFO memories 26c and 26d. The three non-zero values of the vector $Z_n$ are written to the FIFO memories 26a, 26b and 26d.

Figure 10A:
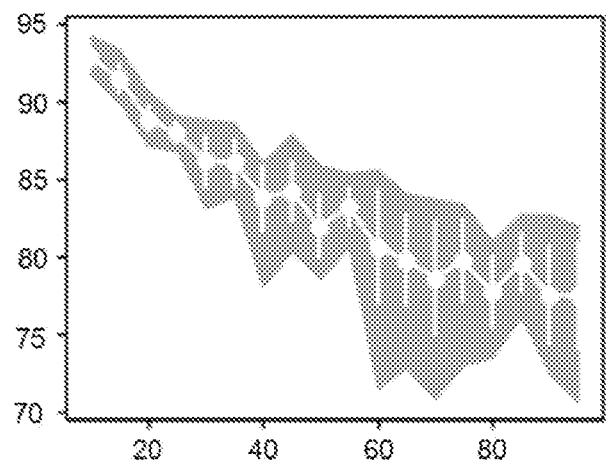
FIG. 10a shows a graph of the degree of fullness of FIFO memories according to a first embodiment of the invention as a function of the degree of parsimony of the data.
Figure 10B:
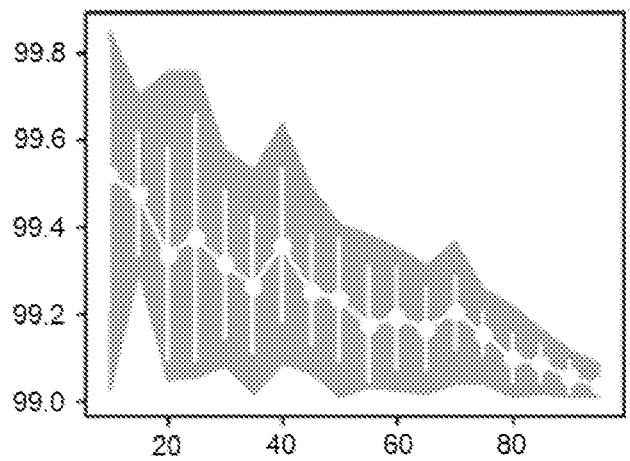
FIG. 10b shows a graph of the degree of fullness of FIFO memories according to a second embodiment of the invention as a function of the degree of parsimony of the data.

The operations that rearrange the order of the values in the data vector allow a balanced distribution of the non-zero values between the various FIFO memories to be ensured so as to maximize the degree of fullness and minimize the rate of data loss, as may be seen in FIGS. 10a and 10b.

FIGS. 10a and 10b show, in graph format, the degree of fullness of the FIFO memories 26a-26d as a function of the degree of parsimony of the data.

FIG. 10a illustrates the results obtained with the first embodiment of the invention without rearrangement of the data in the input vector.

FIG. 10b illustrates the results obtained with a rearrangement of the data corresponding to the mechanism illustrated in FIG. 4.

It will be noted that the rearrangement of the data allows the degree of fullness of the FIFO memories to be significantly improved, it remaining above 99% whatever the degree of parsimony of the data.

Figure 5:
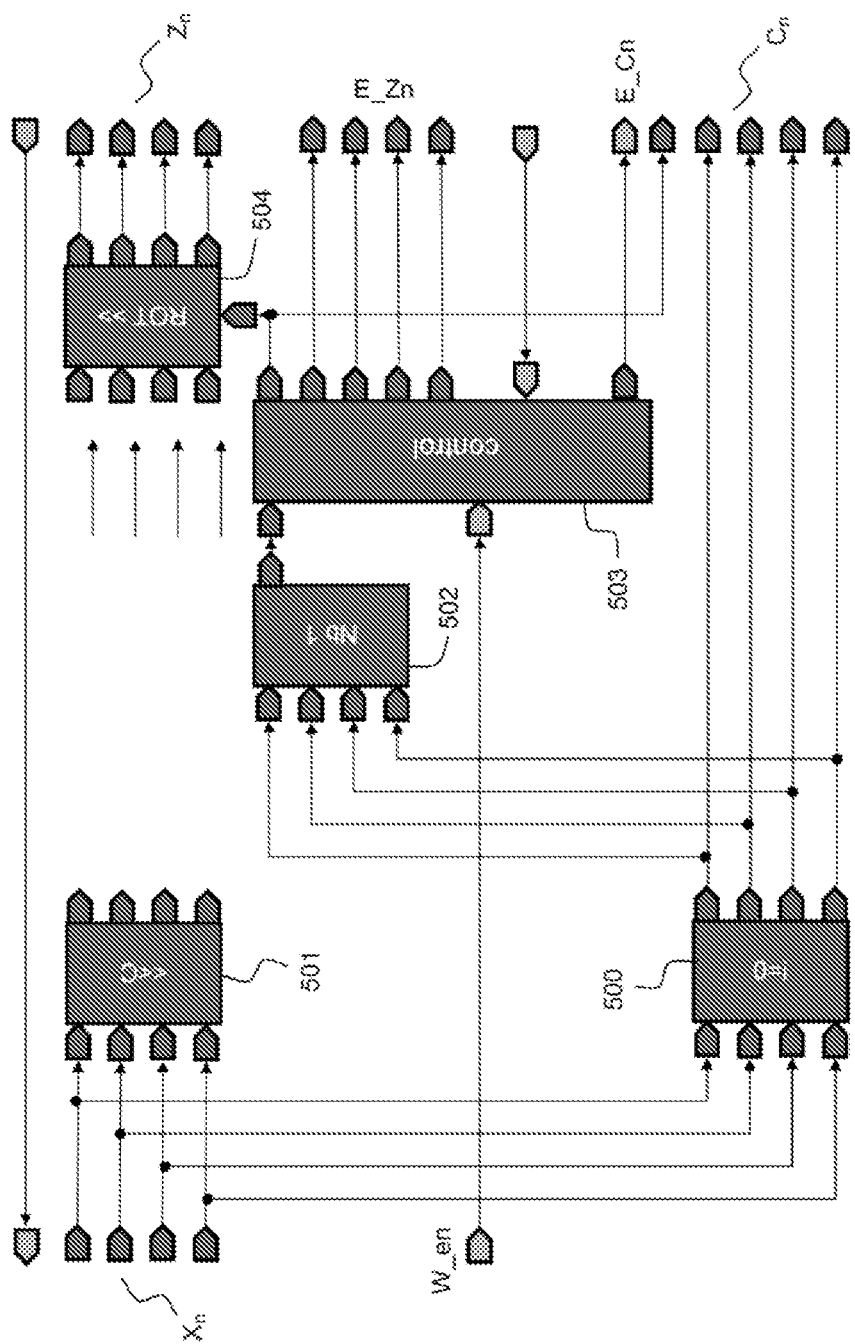
FIG. 5 shows one example of a hardware implementation of the encoder.

FIG. 5 schematically shows one example of a hardware architecture of the encoder circuit 21. In this example, the size of the input vector $X_n$ is equal to 4, as in the example of FIG. 4.

The encoder comprises a detector 500 of values set to 0 in the input vector $X_n$ that produces a code vector $C_n$ in which the non-zero values of the input vector $X_n$ are identified by values set to 1.

The encoder comprises a concatenation logic operator 501 for concatenating the non-zero values of the vector $X_n$ at one end of the vector.

A counter 502 is used to count the number of non-zero values in the code vector in order to determine the value of the rotation to be applied at the time n+1. This value is delivered to a control unit 503 that controls a rotation logic operator 504 that applies the rotation determined at the preceding time to the data output from the unit 501.

The control unit 503 produces write signals $E\_Z_n$ that allow which (non-zero) data of the output vector of the operator 504 must be written to the FIFO memories to be indicated. It likewise produces a write signal $E\_C_n$ for controlling writing of the code vector $C_n$ to the first memory region.

Figure 6A:
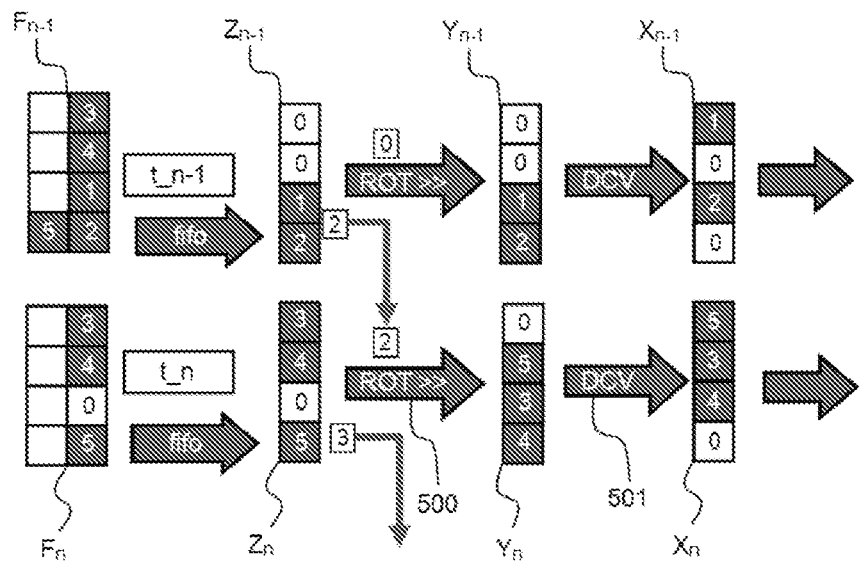
FIG. 6a shows a first schematic illustrating the operating principle of the decoder of the memory circuit of FIG. 2 according to one embodiment of the invention.
Figure 6B:
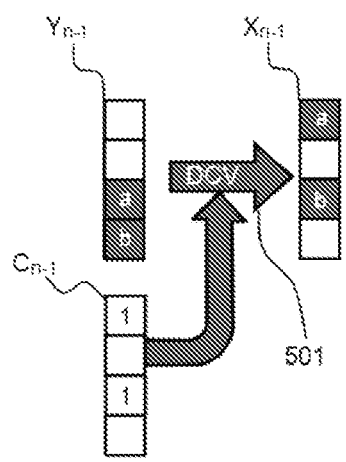
FIG. 6b shows a second schematic illustrating the principle of the decoder of the memory circuit of FIG. 2 according to one embodiment of the invention.

FIGS. 6a and 6b illustrate the operations carried out by the decoder 22.

FIG. 6a shows the state $F_{n-1}$ of the FIFO memories 26a-26d at the time $t_{n-1}$ to a depth of two values per FIFO memory. At the time $t_{n-1}$, the FIFO memories 26a, 26b, 26c each contain a single value (corresponding to the grey boxes in FIG. 6a) and the FIFO memory 26d contains two values.

At the time $t_{n-1}$, by virtue of the information contained in the code vector $C_{n-1}$, the decoder knows that it must read two non-zero values from the FIFO memories 26c and 26d. It thus constructs the vector $Z_{n-1}$. Next, it applies a circular rotation operation 500 parameterized by a rotation value ROT determined depending on the number of non-zero values in the preceding vector. It applies this rotation to create the vector $Y_{n-1}$. Lastly, it applies an operation 501 that rearranges the position of the non-zero data in the vector, again on the basis of information contained in the code vector $C_{n-1}$. After this operation, the vector $X_{n-1}$ is obtained, which is the original data vector received by the encoder.

At the time $t_n$, the encoder reads three non-zero values from the memories 26a, 26b and 26d, applies a rotation of two elements (which rotation is determined by the number of non-zero values in the proceeding vector $Z_{n-1}$) then reorders the non-zero values to obtain the vector $X_n$.

FIG. 6b illustrates the operation 501 that rearranges the non-zero data a and b of the vector $Y_{n-1}$ to get the vector $X_{n-1}$ based on the code vector $C_{n-1}$.

Figure 7:
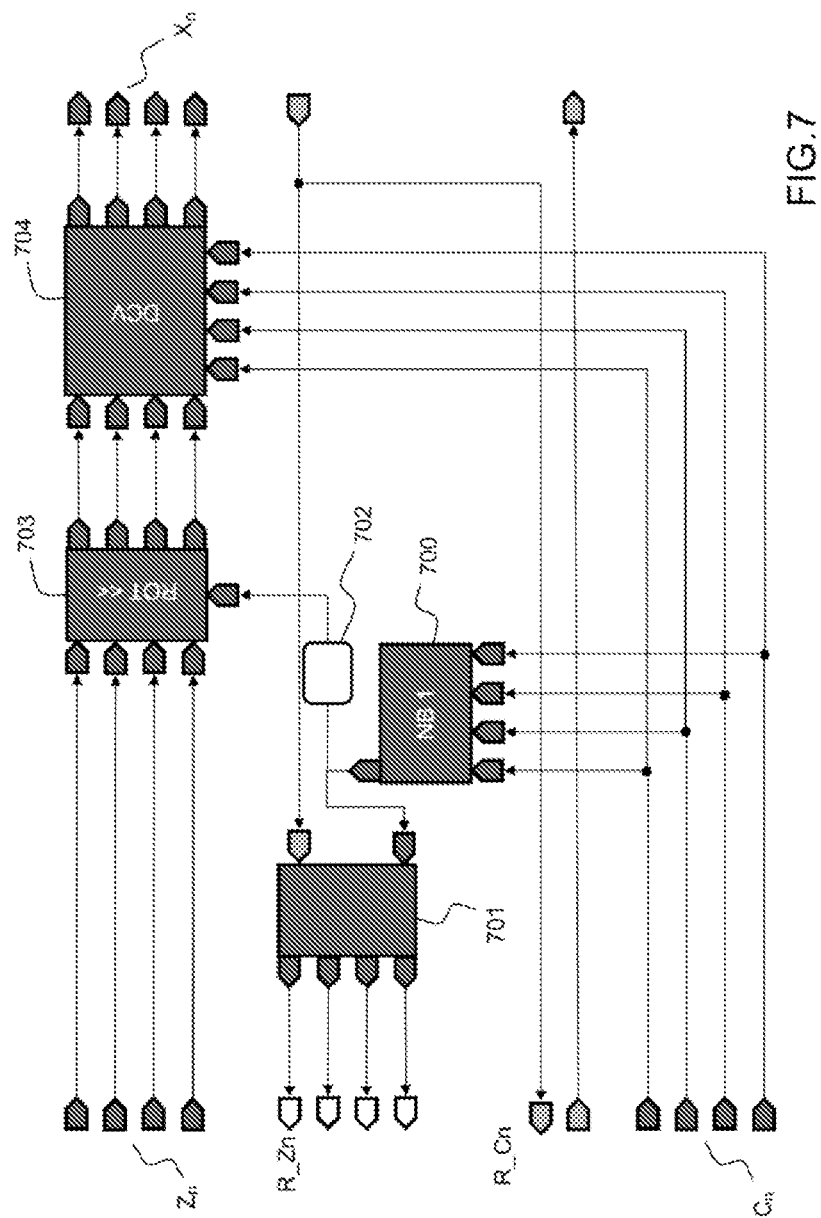
FIG. 7 shows one example of a hardware implementation of the decoder.

FIG. 7 schematically shows one example of a hardware architecture of the decoder circuit 22. In this example, the size of the output vector $X_n$ is equal to 4, as in the preceding example.

The decoder reads the code vector $C_n$ at the time $t_n$ (depending on the read command of the signal $R\_C_n$). A counter 700 of non-zero values allows, on the basis of the code vector $C_n$, control information (equal to the number of non-zero values in the code vector) to be generated, which control information is used to control a read-mask generator 701.

The read-mask generator 701 acts on read control signals $R\_Z_n$ that control read-out from the FIFO memories 26a-26d, depending on the number of non-zero values in the current code vector $C_n$ and on the number of non-zero values in the preceding code vector $C_{n-1}$. These two pieces of information allow the positions of the non-zero values of the input vector $Z_n$ to be determined. Specifically, the number of non-zero values of the current code vector $C_n$ gives the number of non-zero values to be read from the FIFO memories and the number of non-zero values of the preceding code vector $C_{n-1}$ gives the value of the rotation applied by the encoder starting at one end of the vector (operation 401).

The decoder comprises a circular rotation logic operator 703 that allows the inverse circular rotation to be applied to the data vector $Z_n$. The value of the circular rotation is determined on the basis of information detected by the counter 700 in the code vector $C_{n-1}$. To this end, a delay 702 is inserted between the unit 700 and the operator 703.

The decoder also comprises a vector-deconcatenation block 704 (DCV) that allows the values of the vector to be reordered according to the positions of the non-zero values given by the code vector $C_n$. The output vector $X_n$ is thus reconstructed.

Decoding is possible because, in the encoding operations, the order of the non-zero values in the vector is preserved.

As indicated above, the invention is not limited to the examples of encoding and decoding shown in FIGS. 4 to 7 but extends to any encoding function that may be represented in the form of a matrix M for repositioning the non-zero values of the vector X input into the encoder into the vector Z output from the encoder.

Figure 8:
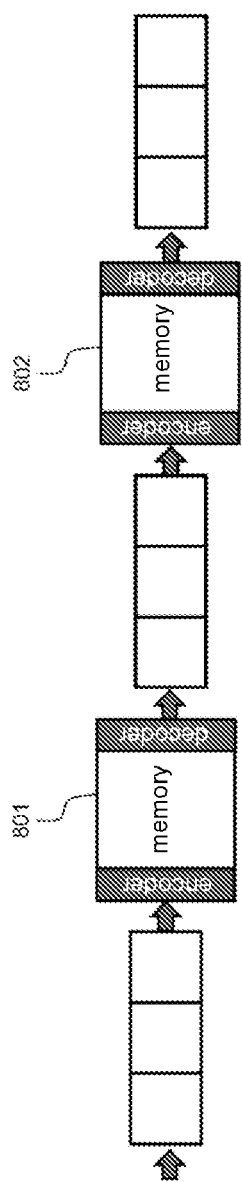
FIG. 8 shows a schematic of a line buffer comprising memory circuits according to a first embodiment of the invention.

FIG. 8 schematically shows a line buffer identical to that of FIG. 1 but in which the conventional FIFO memories have been replaced by memory circuits 801, 802 according to the invention.

The operation of this line buffer is identical to that illustrated in FIG. 1 but the use of memory circuits according to the invention instead of conventional FIFO memories allows memory occupancy to be significantly improved by taking into account the degree of parsimony of the data.

Figure 9:
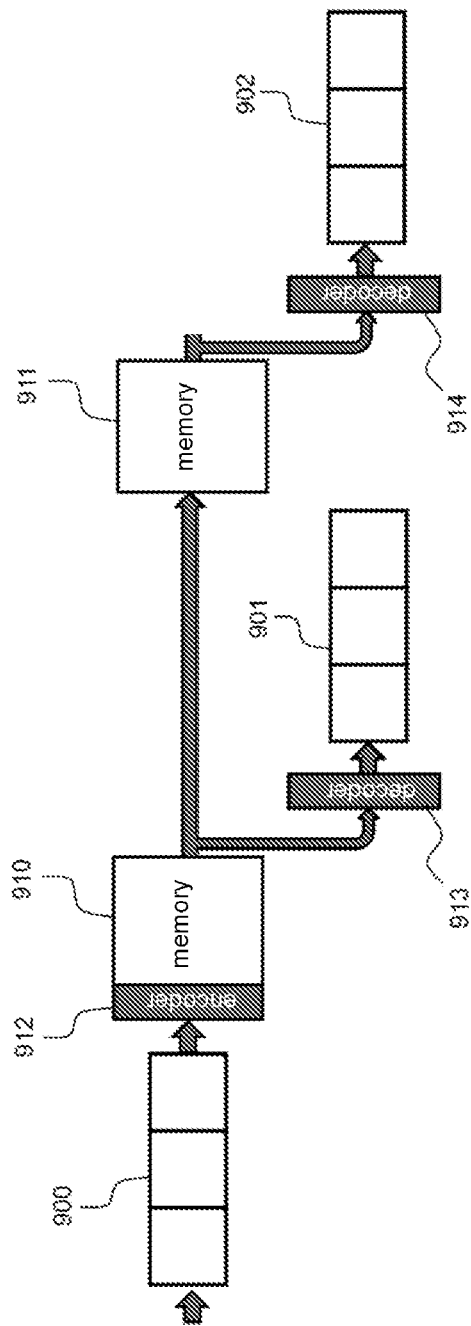
FIG. 9 shows a schematic of a line buffer comprising memory circuits according to a second embodiment of the invention.

FIG. 9 schematically shows one variant embodiment of the line buffer of FIG. 8.

This variant embodiment has the advantage of requiring only a single encoder for the entire line buffer instead of one encoder per memory circuit as in FIG. 8.

The device of FIG. 9 comprises three rows of shift registers 900, 901, 902 just like that of FIG. 8 and that of FIG. 1.

In this variant, the memory circuit comprises a plurality of memory blocks 910, 911 (each comprising one memory region for the code and one memory region for the data, such as described above), an encoder 912 connected to the first memory block 910 and a decoder 913, 914 connected to the output of each memory block 910, 911.

The rows of registers 901 and 902 are connected to the decoders 913 and 914, respectively.

This variant embodiment requires only a single encoder for the entire device whatever the number of rows of registers. This makes it possible to avoid encoding the same data more than once, on input into each memory circuit.

The memory circuit according to the invention may be implemented using hardware components. The hardware elements may, in full or in part, especially take the form of dedicated integrated circuits (ASICs) and/or configurable integrated circuits (FPGAs) and/or the form of neural circuits according to the invention or the form of a digital signal processor (DSP) and/or the form of a graphics processor (GPU), and/or the form of a microcontroller and/or the form of a general-purpose processor, for example. The memory circuit also comprises one or more memories, which may be registers, shift registers, a RAM memory, a ROM memory or any other type of memory suitable for implementing the invention.

The invention claimed is:

1. A FIFO memory circuit for storing parsimonious data, said circuit being configured to receive an input data vector of size Iz at least equal to 1, and comprising:
   an encoder,
   a memory block comprising a first memory region dedicated to encoder information and a second memory region dedicated to the data, the second memory region being divided into a number Iz of FIFO memories, each FIFO memory being associated with one component of the input vector, only non-zero data being saved in the FIFO memories,
   a decoder,
   the encoder being configured to generate an indicator of non-zero data ($C_n$) for each component of the input vector,
   the memory circuit being configured to write the non-zero data of the input data vector to the respective FIFO memories and to write the indicator of non-zero data ($C_n$) to the first memory region,
   the decoder being configured to read the outputs of the FIFO memories and the associated indicator ($C_n$) in the first memory region to reconstruct the data vector,
   the encoder further being configured to rearrange the order of the non-zero data in the data vector so as to balance the number of non-zero data saved in each FIFO memory and the decoder further being configured to apply the inverse operation of the encoder to the outputs of the FIFO memories.

2. The memory circuit according to claim 1, wherein the encoder is configured to execute the following operations on the input data vector:
   concatenating the non-zero values of the vector at one end of the vector,
   applying a circular rotation to the components of the vector.

3. The memory circuit according to claim 2, wherein the circular rotation is carried out on a number of values equal to the number of non-zero values of the preceding vector processed by the encoder.

4. The memory circuit according to claim 1, wherein the decoder is configured to execute the following operations:
   forming a vector ($Z_n$) of size Iz from the outputs of a number of FIFO memories that is determined on the basis of the indicator of non-zero data ($C_n$, $C_{n-1}$) read from the first memory region,
   applying to the vector a circular rotation that is the inverse of that applied by the encoder,
   reordering the values of the vector depending on the indicator of non-zero data ($C_n$).

5. The memory circuit according to claim 4, wherein the inverse circular rotation is determined on the basis of the indicator of non-zero data ($C_{n-1}$) of the preceding vector processed by the decoder.

6. The memory circuit according to claim 1, wherein the FIFO memories are dimensioned depending on a degree of parsimony of the input data.

7. The memory circuit according to claim 1, wherein the memory block is made up of a plurality of memory sub-blocks each comprising a first memory region dedicated to encoder information and a second memory region dedicated to the data, the memory circuit comprising a single encoder and one decoder for each memory sub-block.

8. The line buffer comprising a plurality of groups of pipeline registers and a memory circuit according to claim 7, the first group of pipeline registers being connected to the input of the encoder of the memory circuit and each decoder of the memory circuit being connected, via its output, to one group of pipeline registers.

9. A line buffer comprising a plurality of groups of pipeline registers, two consecutive groups of pipeline registers being interconnected by a memory circuit according to claim 1.

10. A convolution-computing circuit comprising a line buffer according to claim 9, the circuit being configured to read data organized into the form of a data matrix each component of which is a vector of size Iz at least equal to 1.

11. A neuromorphic circuit comprising a convolution-computing circuit according to claim 10.

* * * * *